(12) United States Patent
Yabe et al.

(10) Patent No.: US 10,984,874 B1
(45) Date of Patent: Apr. 20, 2021

(54) DIFFERENTIAL DBUS SCHEME FOR LOW-LATENCY RANDOM READ FOR NAND MEMORIES

(71) Applicant: SanDisk Technologies LLC, Addison, TX (US)

(72) Inventors: Hiroki Yabe, Kanagawa (JP); Koichiro Hayashi, Kanagawa (JP); Takuya Ariki, Kanagawa (JP); Naoki Ookuma, Kanagawa (JP); Toru Miwa, Kanagawa (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/681,968

(22) Filed: Nov. 13, 2019

(51) Int. Cl.
| | |
|---|---|
| *G11C 16/28* | (2006.01) |
| *H01L 27/11556* | (2017.01) |
| *G11C 16/04* | (2006.01) |
| *G11C 16/24* | (2006.01) |
| *H01L 27/11582* | (2017.01) |

(52) U.S. Cl.
CPC ......... *G11C 16/28* (2013.01); *G11C 16/0441* (2013.01); *G11C 16/0483* (2013.01); *G11C 16/24* (2013.01); *H01L 27/11556* (2013.01); *H01L 27/11582* (2013.01)

(58) Field of Classification Search
CPC ........... G11C 7/08; G11C 16/26; G11C 16/28; G11C 16/24; G11C 27/11582; G11C 16/0483; G11C 27/11556; G11C 16/0441
USPC .............................................. 365/185.11, 205
See application file for complete search history.

(56) References Cited

U.S. PATENT DOCUMENTS

| | | | | |
|---|---|---|---|---|
| 4,238,838 A | * | 12/1980 | Wright ............... | G11C 5/00 365/207 |
| 5,027,326 A | * | 6/1991 | Jones ................. | G06F 5/10 365/189.02 |
| 5,929,660 A | * | 7/1999 | Dillinger ............ | G11C 7/067 327/51 |
| 6,043,527 A | * | 3/2000 | Forbes ............... | G11C 8/16 257/296 |
| 6,282,135 B1 | * | 8/2001 | Proebsting ......... | G11C 7/065 257/E21.659 |
| 6,426,560 B1 | * | 7/2002 | Kawamura ......... | G11C 5/02 257/735 |
| 7,443,714 B1 | * | 10/2008 | Kim ................... | G11C 11/4076 365/149 |
| 8,576,649 B1 | * | 11/2013 | Nemati ............... | G11C 7/065 365/205 |
| 10,304,523 B2 | * | 5/2019 | Kato .................. | G11C 11/4096 |
| 10,431,291 B1 | * | 10/2019 | Derner ............... | G11C 11/4091 |

(Continued)

FOREIGN PATENT DOCUMENTS

WO 2016182755 A1 11/2016

OTHER PUBLICATIONS

International Search Report and Written Opinion, PCT/US2020/024560, dated Jul. 31, 2020.

*Primary Examiner* — Michael T Tran
(74) *Attorney, Agent, or Firm* — Dickinson Wright PLLC; Steven Hurles (57) ABSTRACT

A random access memory is provided including a plane structure comprising a plurality of sense amplifiers, each including a local data latch, a pair of local busses connected to each of the data latches, a differential data bus, and a pair of redrivers connected between the pair of local busses and the differential data bus.

18 Claims, 8 Drawing Sheets

(56) References Cited

U.S. PATENT DOCUMENTS

| | | |
|---|---|---|
| 2006/0171237 A1 | 8/2006 | Kaku |
| 2006/0200728 A1 | 9/2006 | Nagai et al. |
| 2006/0227647 A1* | 10/2006 | Kyung-Whan .......... G11C 8/16 365/230.05 |
| 2007/0070759 A1* | 3/2007 | Leung ...................... G11C 8/08 365/208 |
| 2008/0031065 A1 | 2/2008 | Kajitani et al. |
| 2008/0112251 A1* | 5/2008 | Youn ...................... G11C 5/063 365/230.03 |
| 2008/0205177 A1* | 8/2008 | Kim ....................... G11C 5/025 365/205 |
| 2009/0108925 A1* | 4/2009 | Tang ................... G11C 11/413 327/551 |
| 2009/0168588 A1* | 7/2009 | Shim ....................... G11C 8/04 365/230.03 |
| 2009/0198881 A1* | 8/2009 | Toda ................... G06F 11/1048 711/108 |
| 2010/0177571 A1* | 7/2010 | Shori .................. G11C 11/4096 365/189.05 |
| 2013/0250666 A1* | 9/2013 | Shimomura ............ G11C 11/16 365/158 |
| 2014/0063887 A1 | 3/2014 | Vogelsang |
| 2015/0170730 A1* | 6/2015 | Antonyan ........... G11C 11/4091 365/189.07 |
| 2016/0232956 A1* | 8/2016 | Ishizu ...................... G11C 8/08 |
| 2016/0335222 A1* | 11/2016 | Schnell ............... G06F 13/4286 |
| 2016/0360138 A1* | 12/2016 | Meynants ......... H01L 27/14609 |
| 2017/0249976 A1* | 8/2017 | Bringivijayaraghavan ................. G11C 7/1051 |
| 2018/0340978 A1* | 11/2018 | Yabuuchi ................ G06F 11/27 |
| 2019/0068397 A1* | 2/2019 | Chen ...................... H04L 12/40 |
| 2019/0130965 A1* | 5/2019 | Siddiqui ............... G11C 11/419 |
| 2019/0149265 A1* | 5/2019 | Das Sharma ......... H04L 1/0076 714/776 |
| 2019/0325949 A1* | 10/2019 | Gupta .................. G11C 11/412 |
| 2019/0348140 A1* | 11/2019 | Cho ....................... G11C 29/52 |
| 2020/0153395 A1* | 5/2020 | Geng ..................... H03F 3/505 |
| 2020/0349990 A1* | 11/2020 | Ingalls ..................... G11C 8/08 |
| 2020/0349999 A1* | 11/2020 | Kawamura ......... G11C 11/4076 |

\* cited by examiner

FIG. 1

RELATED ART

DIFFERENTIAL DBUS SCHEME FOR LOW-LATENCY RANDOM READ FOR NAND MEMORIES

BACKGROUND

1. Field

Apparatuses and methods consistent with example embodiments relate to a three-dimensional (3D) memory device, and more particularly, to a 3D memory device including a differential data bus.

2. Description of the Related Art

3D NAND flash memory is a type of non-volatile flash memory in which memory cells are stacked vertically in multiple layers. 3D NAND was developed to address challenges encountered in scaling two dimensional (2D) NAND technology to achieve higher densities at a lower cost per bit.

A memory cell is an electronic device or component capable of storing electronic information. Non-volatile memory may utilize floating-gate transistors, charge trap transistors, or other transistors as memory cells. The ability to adjust the threshold voltage of a floating-gate transistor or charge trap transistor allows the transistor to act as a non-volatile storage element (i.e. a memory cell), such as a single-level cell (SLC) which stores a single bit of data. In some cases more than one data bit per memory cell can be provided (e.g., in a multi-level cell) by programming and reading multiple threshold voltages or threshold voltage ranges. Such cells include, but are not limited to a multi-level cell (MLC), storing two bits per cell; a triple-level cell (TLC), storing three bits per cell; and a quad-level cell (QLC), storing four bits per cell.

Figure 1:
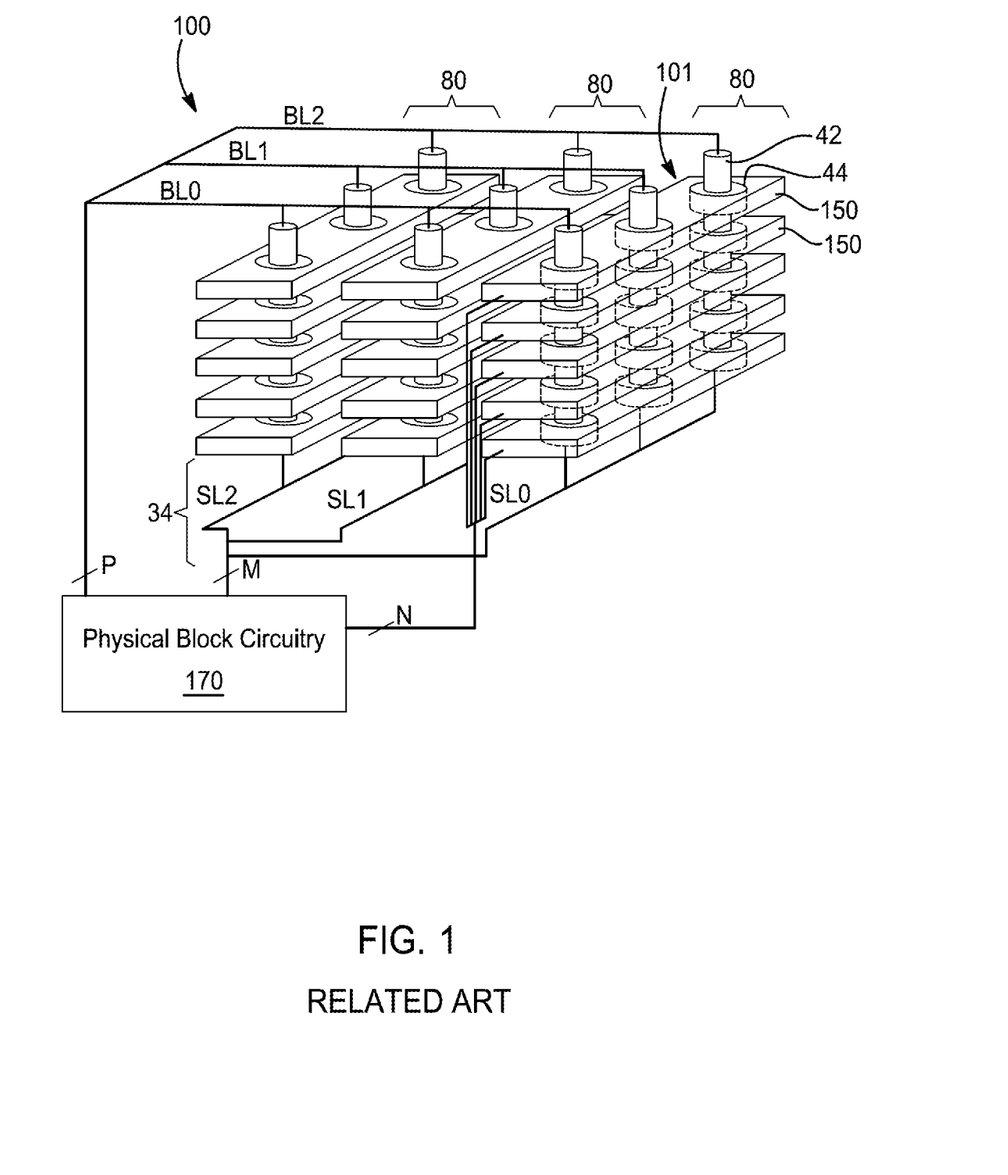
FIG. 1 is a diagram of an example 3D NAND memory array.

FIG. 1 illustrates a diagram of an example 3D NAND memory array 100. In this example, the memory array 100 is a 3D NAND memory array. However, this is just one example of a memory array. The memory array 100 includes multiple physical layers that are monolithically formed above a substrate 34, such as a silicon substrate.

Storage elements, for example memory cells 101, are arranged in arrays in the physical layers. A memory cell 101 includes a charge trap structure 44 between a word line 150 and a conductive channel 42. Charge can be injected into or drained from the charge trap structure 44 via biasing of the conductive channel 42 relative to the word line 150. For example, the charge trap structure 44 can include silicon nitride and can be separated from the word line 150 and the conductive channel 42 by a gate dielectric, such as a silicon oxide. An amount of charge in the charge trap structure 44 affects an amount of current through the conductive channel 42 during a read operation of the memory cell 101 and indicates one or more bit values that are stored in the memory cell 101.

The 3D memory array 100 includes multiple blocks 80. Each block 80 includes a "vertical slice" of the physical layers that includes a stack of word lines 150. Multiple conductive channels 42 (having a substantially vertical orientation, as shown in FIG. 1) extend through the stack of word lines 150. Each conductive channel 42 is coupled to a storage element in each word line 150, forming a NAND string of storage elements, extending along the conductive channel 42. FIG. 1 illustrates three blocks 80, five word lines 150 in each block 80, and three conductive channels 42 in each block 80 for clarity of illustration. However, the 3D memory array 100 can have more than three blocks, more than five word lines per block, and more than three conductive channels per block.

Physical block circuitry is coupled to the conductive channels 42 via multiple conductive lines: bit lines, illustrated as a first bit line BL0, a second bit line BL1, and a third bit line BL2 at a first end of the conductive channels (e.g., an end most remote from the substrate 34) and source lines, illustrated as a first source line SL0, a second source line SL1, and a third source line SL2, at a second end of the conductive channels (e.g., an end nearer to or within the substrate 234). The physical block circuitry 252 is illustrated as coupled to the bit lines BL0-BL2 via "P" control lines, coupled to the source lines SL0-SL2 via "M" control lines, and coupled to the word lines 150 via "N" control lines. Each of P, M, and N can have a positive integer value based on the specific configuration of the 3D memory array 100.

Each of the conductive channels 42 is coupled, at a first end to a bit line BL, and at a second end to a source line SL. Accordingly, a group of conductive channels 42 can be coupled in series to a particular bit line BL and to different source lines SL.

It is noted that although each conductive channel 42 is illustrated as a single conductive channel, each of the conductive channels 42 can include multiple conductive channels that are in a stack configuration. The multiple conductive channels in a stacked configuration can be coupled by one or more connectors. Furthermore, additional layers and/or transistors (not illustrated) may be included as would be understood by one of skill in the art.

Among other things, the physical block circuitry 170 facilitates and/or effectuates read and write operations performed on the 3D memory array 100. For example, data can be stored to storage elements coupled to a word line 150 and the circuitry 170 can read bit values from the memory cells 101.

Typically, in a random-access memory system, an external data latch (XDL) operates as a buffer between an internal data latch, within a sense amplifier in the physical block circuitry, and the input/output (I/O). During a programming operation, the data is transmitted from the I/O, to the XDL, and to the internal latches. During a read operation, the data is read to the internal data latches, to the temporary buffer of the XDL, and from there to the I/O. However, this is a relatively time-consuming process, requiring about 4 μs for the transfer from the internal data latch to the XDL, and not particularly suitable for random access memory. There is a desire for a design and method providing a faster, lower-latency read.

SUMMARY

Example embodiments may address at least the above problems and/or disadvantages and other disadvantages not described above. Also, example embodiments are not required to overcome the disadvantages described above, and may not overcome any of the problems described above.

One or more example embodiments may provide a system and method for a low-latency read operation of a random-access memory including differential local and data busses, and a redriver.

According to an aspect of an example embodiment, a circuit structure of a random-access memory is provided. The circuit structure comprising a sense amplifier, a first local bus connected to the sense amplifier, a second local bus connected to the sense amplifier, a first data bus and a second data bus, a first redriver connected between the first local bus and the first data bus, and a second redriver connected between the second local bus and the second data bus.

The sense amplifier may comprise a local data latch connected to the first local bus and the second local bus.

The circuit structure may include a select switch comprising a switching element connected between the first local bus and the first redriver and connected between the second local bus and the second redriver.

An amplifier may be connected to the first data bus and the second data bus.

According to an aspect of another example embodiment, a plane structure of a random access memory is provided. The plane structure comprises a plurality of vertical stacks, each comprising a plurality of sense amplifiers and a pair of local buses connected to each of the plurality of sense amplifiers. The plane structure further comprises a pair of data busses and a pair of redrivers respectively connected between the pair of local busses of each of the plurality of vertical stacks and the pair of data busses.

Each of the plurality of sense amplifiers may comprise a local data latch.

The plane structure may also comprise a select switch comprising a plurality of switching elements respectively corresponding to the plurality of vertical stacks. A respective one of the plurality of switching elements may be connected between the pair of local buses of each respective one of the plurality of vertical stacks, and the first and second redrivers, such that operation of the select switch connects the first local bus and the second local bus of one of the plurality of vertical stacks to the first redriver and the second redriver, respectively.

Each of the plurality of vertical stacks may further comprise sixteen bit lines connected to the plurality of sense amplifiers.

The plurality of vertical stacks may be four vertical stacks, and the plurality of sense amplifiers of each of the four vertical stacks may be four sense amplifiers, such that the pair of data busses is connected to 144 sense amplifiers.

An amplifier may be connected to the pair of data busses.

According to an aspect of another example embodiment, a method of reading a cell of a random-access memory is provided. The method comprises a local data latch of a sense amplifier transmitting a signal via a pair of local busses connected to the sense amplifier, a redriver buffering the signal transmitted from the pair of local busses, transmitting the signal from the redriver over a pair of data busses, and outputting the signal transmitted over the pair of data busses, to an output of the random-access memory.

The transmitting the signal the signal via the pair of local busses may comprise transmitting the signal via a select switch.

The method may further comprise amplifying the signal transmitted over the pair of data busses.

The method may further comprise, prior to the local data latch transmitting the signal, the local data latch receiving the signal via one of sixteen bit lines connected to the sense amplifier.

According to an aspect of another example embodiment, a method is provided of driving a differential data bus of a random-access memory, the differential data bus comprising a first data bus and a second data bus. The method comprises discharging one of a first local bus and a second local bus connected to a sense amplifier, thereby providing a voltage different between the first local bus and the second local bus; transmitting a voltage in the first local bus to the first data bus via a first redriver circuit connected between the first local bus and the first data bus; and transmitting the voltage in the second local bus to the second data bus via a second redriver circuit connected between the first local bus and the second data bus.

The method may further comprise, prior to the discharging the one of the first local bus and the second local bus, precharging the first local bus and the second local bus.

The discharging the one of the first local bus and the second local bus may comprise discharging using a local data latch within the sense amplifier.

The discharging may further comprise transmitting a voltage via one of a first transfer gate and a second transfer gate within the sense amplifier.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Reference will now be made in detail to example embodiments which are illustrated in the accompanying drawings, wherein like reference numerals refer to like elements throughout. In this regard, the example embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third,' etc., may be used herein to describe various elements, components, regions, layers and/or sections, these elements, components, regions, layers and/or sections may not be limited by these terms. These terms are only used to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er (-or)," and "module" described in the specification refer to an element for performing at least one function or operation, and may be implemented in hardware, software, or the combination of hardware and software.

Various terms are used to refer to particular system components. Different companies may refer to a component by different names—this document does not intend to distinguish between components that differ in name but not function.

Matters of these example embodiments that are obvious to those of ordinary skill in the technical field to which these example embodiments pertain may not be described here in detail.

As noted above, a single-level cell (SLC) stores a single bit of data using two levels. Alternately, a cell can store 2 bits using four levels, 3 bits using eight levels, and 4 bits using sixteen levels.

As discussed above, with respect to random-access memory devices, there is a desire for a faster, lower-latency read operation. A direct read from an internal data latch (SDL), within the sense amplifier (SA), is desirable. However, due to the scattered placement of the sense amplifiers, within which the SDLs reside, the capacitance of the required data bus is large and the sense amplifier transistor can't drive it at speed. Furthermore, due to the large number of sense amplifiers, an increase in the transistor size would require a detrimental increase in chip size. Thus, previously, an external data latch (XDL) has been used as a buffer device.

One or more example embodiments described herein may provide a decreased read latency for random-access memory when reading a 64 byte chunk of data, regardless of the location of the address of the data within the chunk by reading directly from the SDL within the sense amplifier via provision of a differential data bus.

Figure 2:
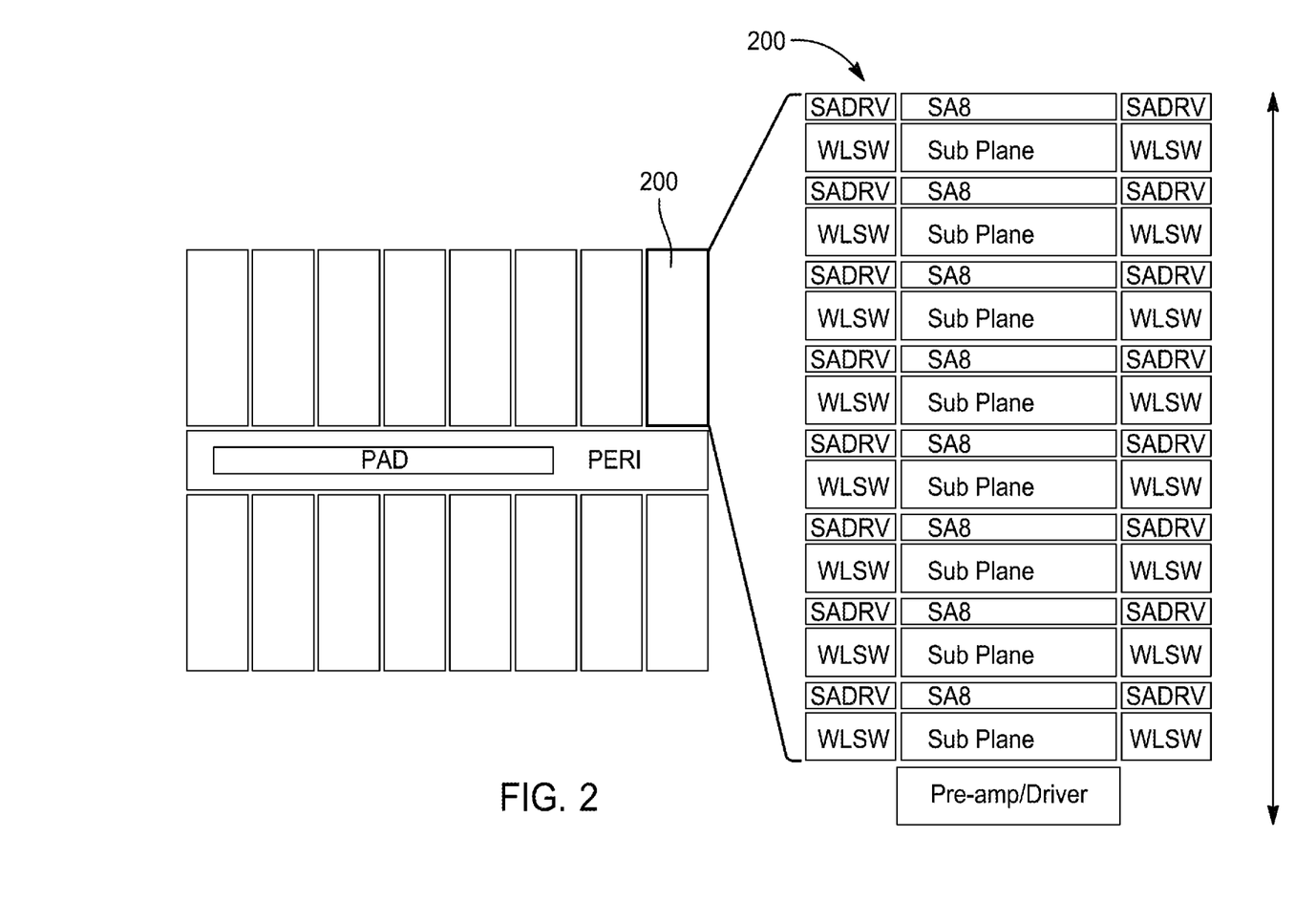
FIG. 2 is a block diagram of a related art high-speed random access read.

FIG. 2 is a block diagram illustrating a related art high-speed random access read. As shown, the structure of each physical plane 200 comprises a vertical stack including multiple sub-planes, sense amplifiers SA, and a pre-amplifier/driver. During a read operation, data is transferred from an internal data latch SDL, in a sense amplifier SA, to the pre-amplifier/driver, requiring a long bus 220 which is driven by the SDL transistor. SADRV is the sense amplifier driver, and WLSW is a word line switch.

Figure 3:
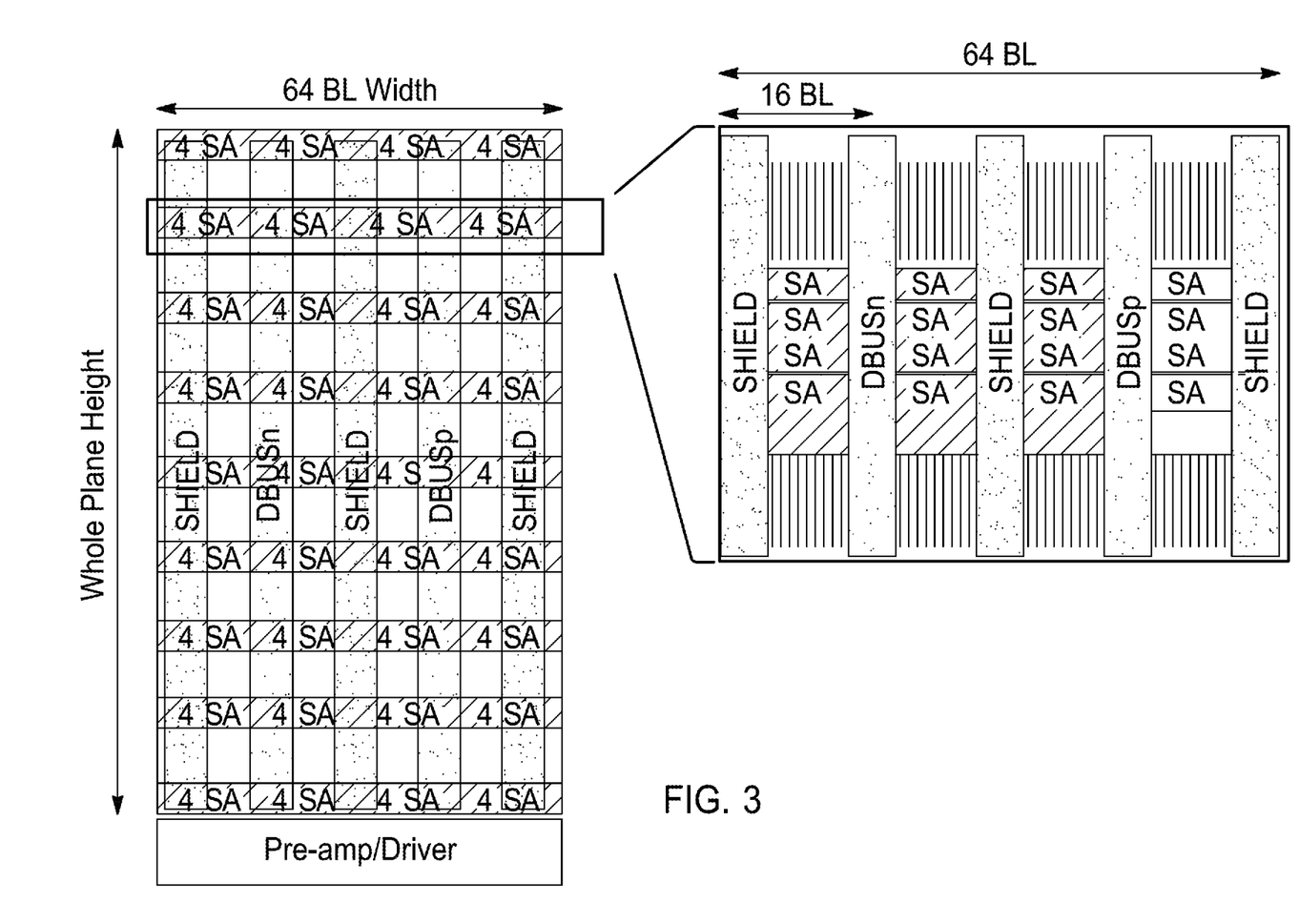
FIG. 3 is a block diagram of a plane and differential bus structure according to an example embodiment.

FIG. 3 is a block diagram of a plane and differential bus structure according to an example embodiment. According to this example embodiment, each plane includes a pair of data busses DBUSn and DBUSp with shields disposed therebetween. These shield lines provide protection against interference from adjacent pairs of data busses, as well as providing power connection to the sense amplifiers. In this figure, the pair of data busses DBUSn and DBUSp run vertically through the plane and intersect each 64-bit linewidth. As would be understood by one of skill in the art, in a case in which a width of greater than 64 bit lines were desired, for example, a width of 128 bit lines, the structure as shown in FIG. 3 could be repeated. The spacing between one of the pair of data busses DBUSn or DBUSp, and the adjacent shields may be 16 bit lines, where each group of 16 bit lines is connected to an "island" including four sense amplifiers SA and a data bus (DBUS)-local bus (LBUS) switch. Accordingly, the whole page includes 144 sense amplifiers SA connected to two data busses, DBUSn and DBUSp.

Figure 4:
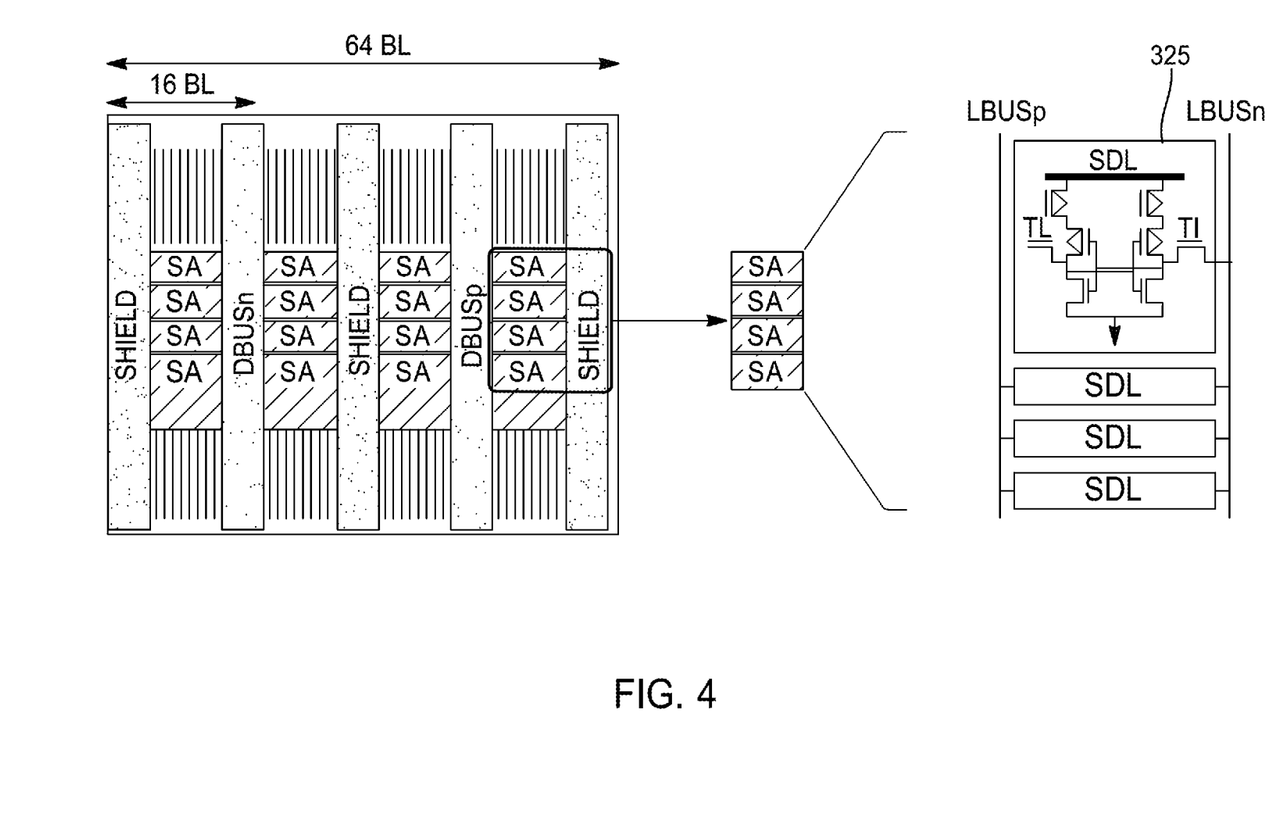
FIG. 4 illustrates a structure of sense amplifiers and local busses according to an example embodiment.

FIG. 4 illustrates a structure of sense amplifiers and data busses according to an example embodiment. It is noted that only the internal data latch (SDL) portion 325 of the circuitry of the sense amplifier SA is illustrated. Each set of four vertically-stacked vertical sense amplifiers SA are connected to a differential local bus LBUSp and LBUSn. When reading from a sense amplifier, only one of the two data busses loads, and it is a voltage difference between the data busses DBUSn and DBUSp that is transmitted. In this case, corresponding to the 16 sense amplifiers, there are four differential pairs of local busses LBUSp and LBUSn. The transfer gates TL and TI, for the latched value and its inverse, respectively, are included in the SDL portion 325.

Figure 5:
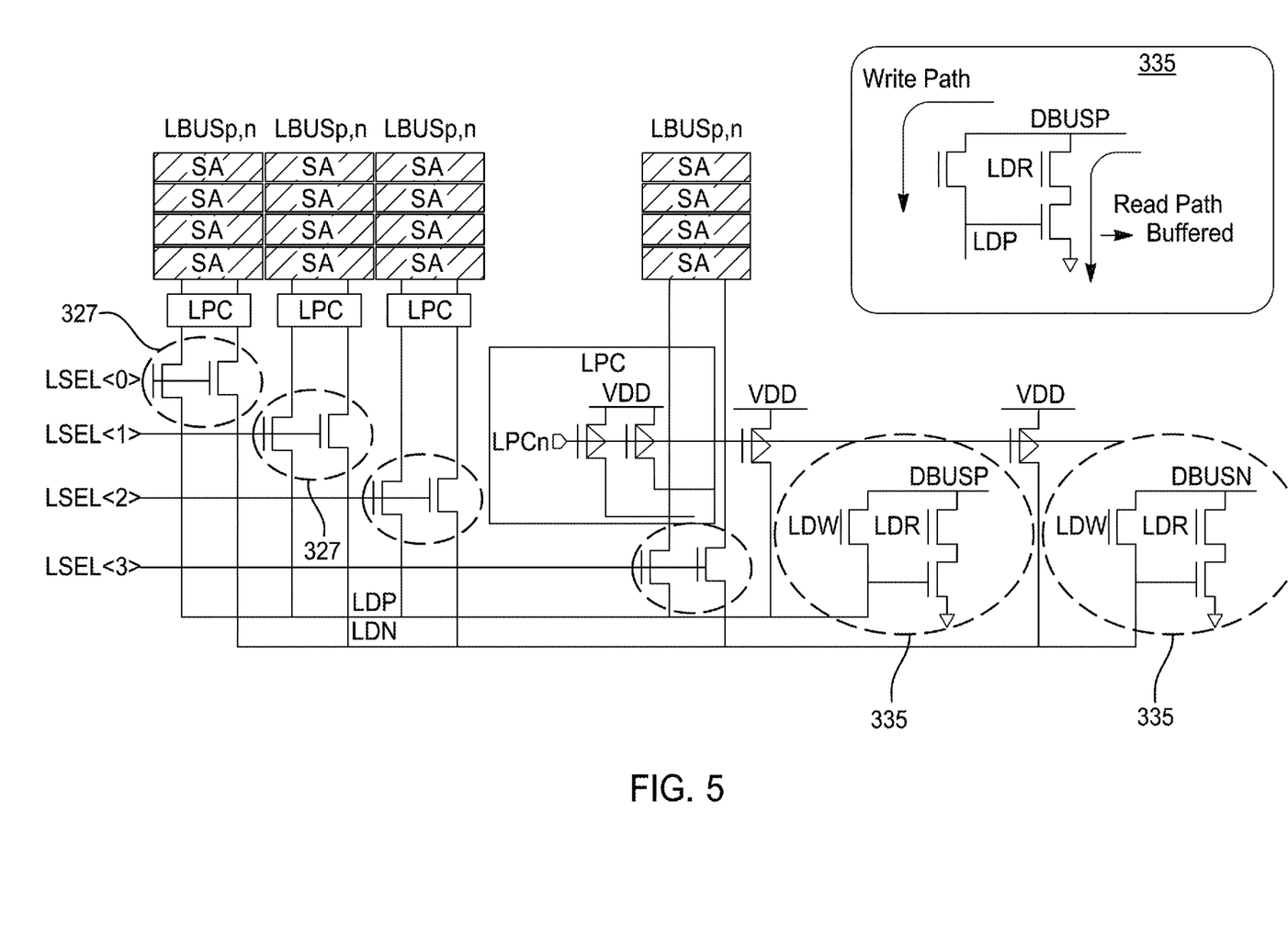
FIG. 5 illustrates a bus structure including switches between the local busses and the data busses, according to an example embodiment.
Figure 6:
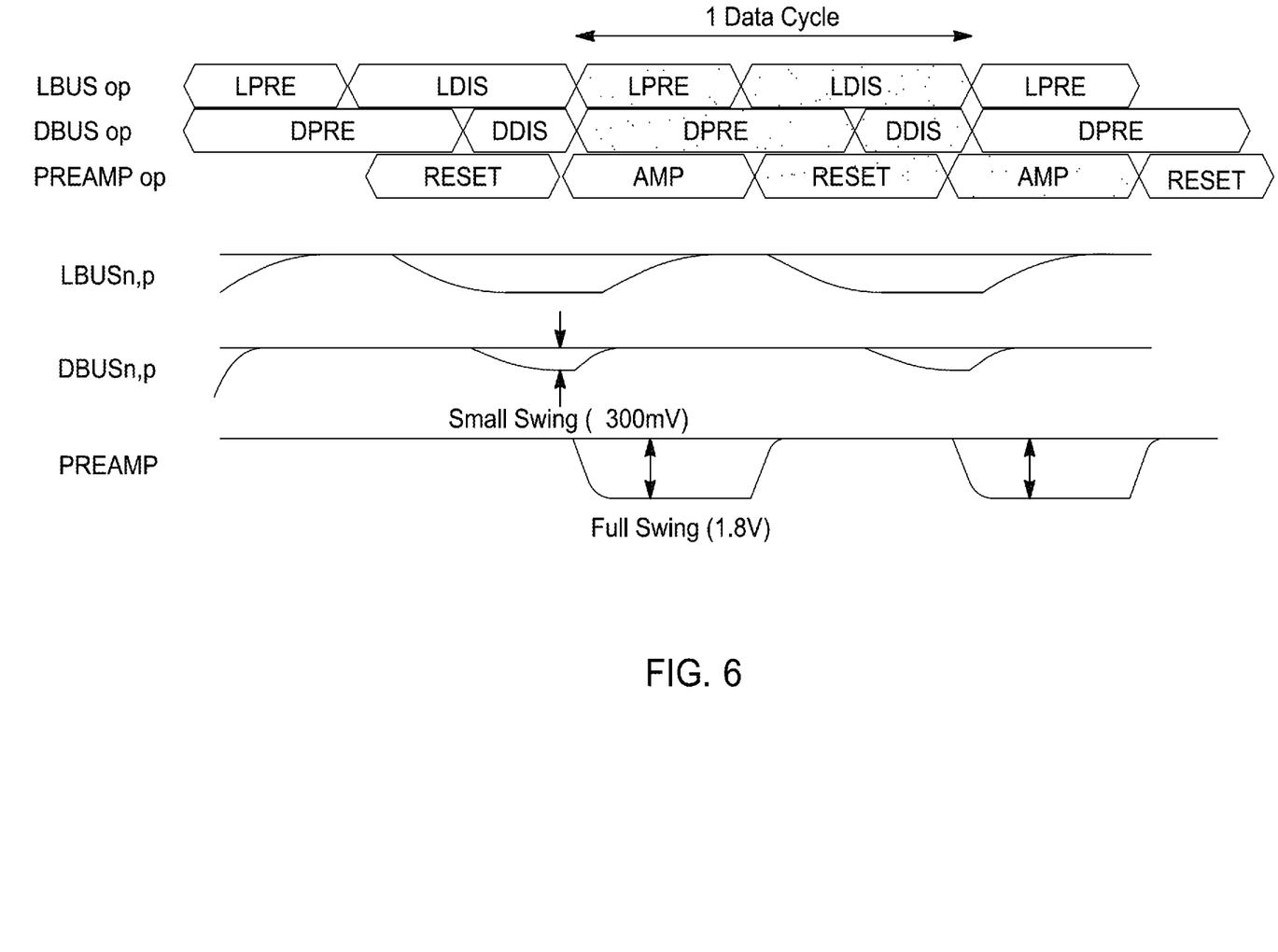
FIG. 6 illustrates waveforms of a read operation according to an example embodiment

FIG. 5 illustrates a bus structure including DBUS-LBUS switches, according to an example embodiment. Using corresponding signals LSEL<0>, LSEL<1>, LSEL<2>, and LSEL<3>, one of the four pairs of LBUSn and LBUSp is connected to local data lines LDP and LDN by LSEL switches 327. The circuits labeled 335 include a redriver part including the transistor labeled LDR and the transistor therebelow. The circuits 335 also include a transistor LDW used for write only. The circuit labeled LPC (Lbus Pre-Charge) is a pre-charge switch. As shown in FIG. 6, during a read operation, both LBUSp and LBUSn are precharged, and then the data latch discharges one of LBUSp and LBUSn making the voltage difference on the LBUS pair, which is transmitted to LDP and LDN which are temporary data between the LBUS and the DBUS. VDD is a power line.

It is noted that, if the data busses were driven directly by the sense amplifiers SA, the resistance would be too large. Thus, the redrivers of the circuits 335 are used to buffer the signals to drive the corresponding DBUSn or DBUSp. One circuit 335 is connected between the LDP line and the DBUSn, and another circuit 335 is connected between the LDN line and the DBUSn, as shown.

When reading data, an LDR transistor is used, and the LDR transistor redrives the data to the DBUS during the DOUT operation. When writing data, the LDW transistor and one LBUS is used to write the data.

It is noted that the transistors of the circuits 335 may be made large without causing much area increase.

The differential signaling is also amplified, as would be understood by one of skill in the art.

FIG. 6 illustrates waveforms of a DOUT (data out) read operation according to an example embodiment. When reading out the local data latch SDL with LBUSn and LBUSp, as shown, one of the signals goes down, while the other signal remains high. The signal is then redriven and transmitted to the DBUS, with a "small swing"—i.e. a relatively small difference between the signal of the DBUSn and the DBUSp, of, for example, about 300 mV, as shown. The differential is then amplified to have a "full swing"—i.e. a difference of about 1.8V between the signals, by the preamp as shown. A dynamic comparator, as would be understood by one of skill in the art, may be used as the preamp. Thus, by amplification of the signals, the "small swing" signal may be used to read out the data.

Figure 7A:
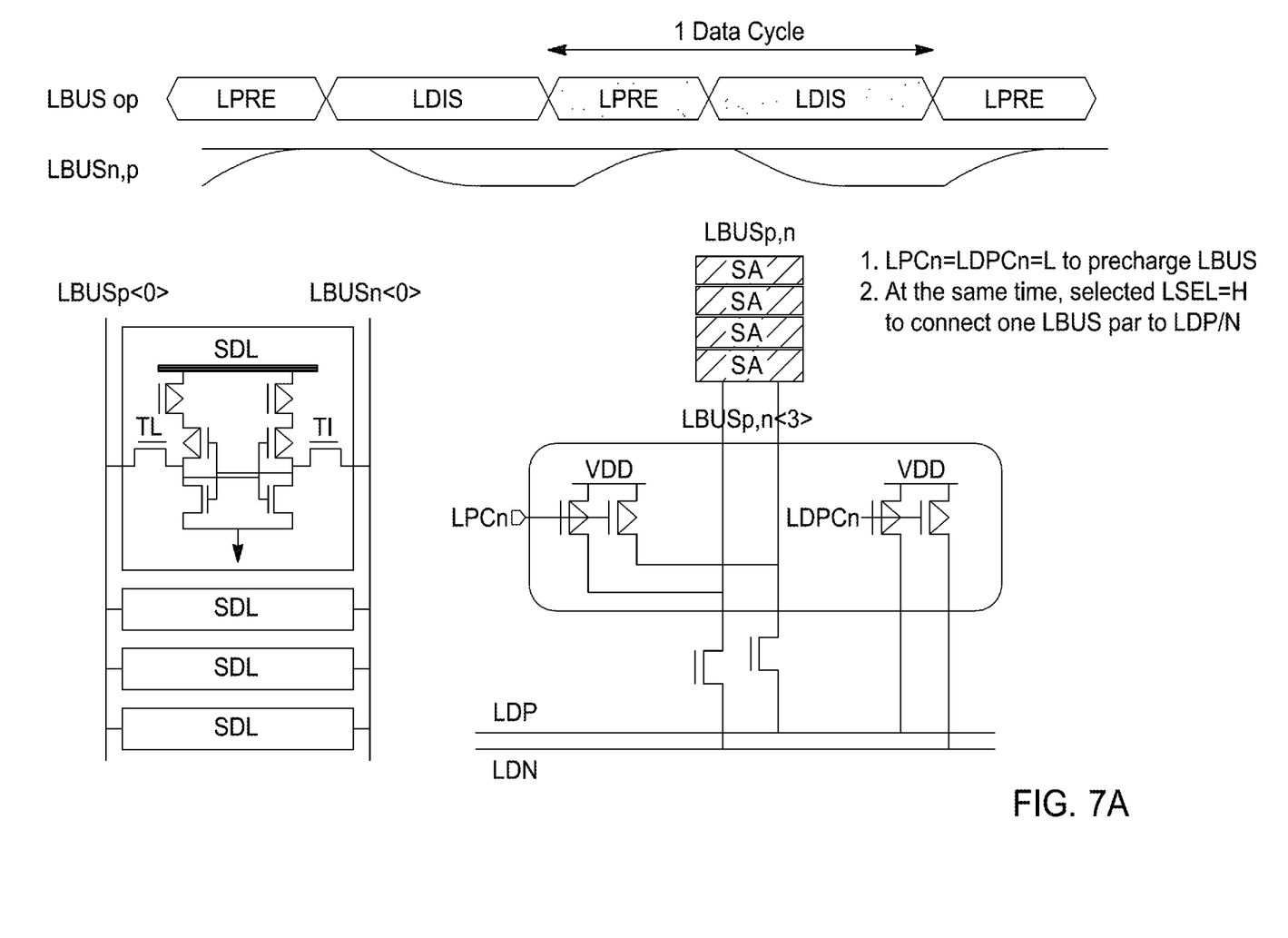
FIG. 7A and FIG. 7B illustrate the waveforms of an LBUSn and an LBUSp according to an example embodiment.
Figure 7B:
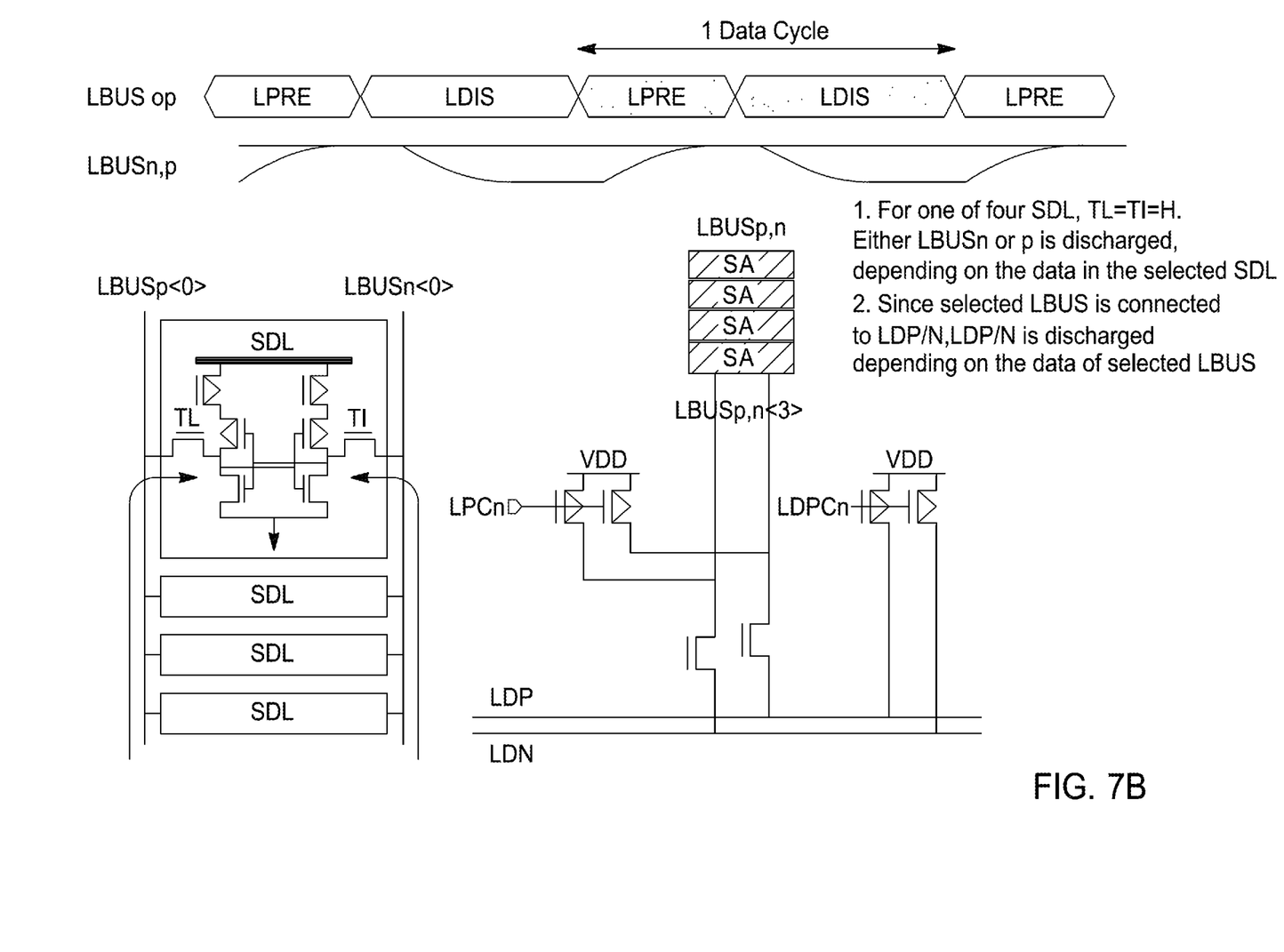

FIG. 7A illustrates the waveform of the LBUSn and LBUSp according to an example embodiment, as well as the pre-charge switch, during precharge. FIG. 7B illustrates the waveform of the LBUSn and LBUSp according to this example embodiment, as well as the pre-charge switch, during a discharge operation. As shown, depending on the data in the selected SDL, either the LBUSn or the LBUSp is discharged.

It may be understood that the example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A circuit structure of a random-access memory, the circuit structure comprising:
   a sense amplifier;
   a pair of local busses connected to the sense amplifier;
   a differential data bus comprising a first data bus and a second data bus;
   a first redriver connected between a first local bus of the pair of local busses and the first data bus and configured to transmit a first voltage from the first local bus to the first data bus; and
   a second redriver connected between a second local bus of the pair of local busses and the second data bus and configured to transmit a second voltage from the second local bus to the second data bus.

2. The circuit structure according to claim 1, wherein the sense amplifier comprises a local data latch connected to the first local bus and the second local bus.

3. The circuit structure according to claim 1, further comprising:
   a select switch comprising a switching element connected between the first local bus and the first redriver and connected between the second local bus and the second redriver.

4. The circuit structure according to claim 1, further comprising an amplifier connected to the differential data bus.

5. A plane structure of a random access memory, the plane structure comprising:
   a plurality of vertical stacks, each comprising:
      a plurality of sense amplifiers,
      a pair of local buses connected to each of the plurality of sense amplifiers;
   a differential data bus comprising a first data bus and a second data bus; and
   a first redriver connected between a first local bus, of the pair of local busses, and the first data bus and configured to transmit a first voltage from the first local bus to the first data bus; and
   a second redriver connected between a second local bus, of the pair of local busses, and the second data bus and configured to transmit a second voltage from the second local bus to the second data bus.

6. The plane structure according to claim 5, wherein each of the plurality of sense amplifiers comprises a local data latch.

7. The plane structure according to claim 5, further comprising:
   a select switch comprising a plurality of switching elements respectively corresponding to the plurality of vertical stacks, wherein a respective one of the plurality of switching elements is connected between:
      the pair of local buses of each respective one of the plurality of vertical stacks, and
      the first redriver and second redriver;
   wherein operation of the select switch connects the first local bus and the second local bus of one of the plurality of vertical stacks to the first redriver and the second redriver, respectively.

8. The plane structure according to claim 5, wherein each of the plurality of vertical stacks further comprises sixteen bit lines connected to the plurality of sense amplifiers.

9. The plane structure according to claim 5, wherein the plurality of vertical stacks is four vertical stacks, and the plurality of sense amplifiers of each of the four vertical stacks is four sense amplifiers, such that the differential data bus is connected to 144 sense amplifiers.

10. The plane structure according to claim 5, further comprising an amplifier connected to the differential data bus.

11. A method of reading a cell of a random-access memory, the method comprising:
    a local data latch of a sense amplifier transmitting a signal that includes first and second voltages via a pair of local busses connected to the sense amplifier;
    a redriver buffering the signal transmitted from the pair of local busses;
    transmitting the signal from the redriver over a differential data bus; and
    outputting the signal transmitted over the differential data bus, to an output of the random-access memory.

12. The method according to claim 11, wherein the transmitting the signal the signal via the pair of local busses comprises transmitting the signal via a select switch.

13. The method according to claim 11, further comprising amplifying the signal transmitted over the differential data bus.

14. The method according to claim 11, further comprising, prior to the local data latch transmitting the signal, the local data latch receiving the signal via one of sixteen bit lines connected to the sense amplifier.

15. A method of driving a differential data bus of a random-access memory, the differential data bus comprising a first data bus and a second data bus, the method comprising:
    discharging one of a first local bus and a second local bus connected to a sense amplifier, thereby providing a voltage different between the first local bus and the second local bus;
    transmitting a voltage in the first local bus to the first data bus via a first redriver circuit connected between the first local bus and the first data bus; and
    transmitting the voltage in the second local bus to the second data bus via a second redriver circuit connected between the first local bus and the second data bus.

16. The method according to claim 15, further comprising, prior to the discharging the one of the first local bus and the second local bus, precharging the first local bus and the second local bus.

17. The method according to claim 15, wherein the discharging the one of the first local bus and the second local bus comprises discharging using a local data latch within the sense amplifier.

18. The method according to claim 17, wherein the discharging further comprises transmitting a voltage via one of a first transfer gate and a second transfer gate within the sense amplifier.

* * * * *